United States Patent [19]
Badehi

[11] Patent Number: 6,117,707
[45] Date of Patent: *Sep. 12, 2000

[54] METHODS OF PRODUCING INTEGRATED CIRCUIT DEVICES

[75] Inventor: Peirre Badehi, Yehuda, Israel

[73] Assignee: Shellcase Ltd., Jerusalem, Israel

[ * ] Notice: This patent is subject to a terminal disclaimer.

[21] Appl. No.: 08/681,598

[22] Filed: Jul. 29, 1996

Related U.S. Application Data

[62] Continuation of application No. 08/274,251, Jul. 13, 1994, Pat. No. 5,547,906, which is a division of application No. 07/962,222, filed as application No. PCT/EP92/02134, Sep. 14, 1992, Pat. No. 5,455,455.

[51] Int. Cl.⁷ .......................... H01L 21/00; H01L 21/50; H01L 21/44
[52] U.S. Cl. ........................ 438/113; 438/33; 438/38; 438/110; 438/118; 438/460; 438/462; 438/463; 438/464
[58] Field of Search ........................ 438/33, 38, 67, 438/68, 113, 118, 119, 110, 460–464

[56] References Cited

U.S. PATENT DOCUMENTS

| | | | |
|---|---|---|---|
| 2,507,956 | 5/1950 | Bruno | 148/6.2 |
| 2,796,370 | 6/1957 | Ostrander | 148/6.2 |
| 2,851,385 | 9/1958 | Palin | 148/6.2 |
| 3,644,801 | 2/1972 | Sheldon | 252/620 |
| 4,383,886 | 5/1983 | Nakamura | 56/659 |
| 4,794,092 | 12/1988 | Solomon | 437/51 |
| 4,862,249 | 8/1989 | Carlson | 357/80 |
| 4,900,695 | 2/1990 | Takahashi | 437/195 |
| 4,933,898 | 6/1990 | Gilberg | 257/659 |
| 4,971,930 | 11/1990 | Eusaroli | 437/217 |
| 4,984,358 | 1/1991 | Nelson | 29/830 |
| 5,104,820 | 4/1992 | Go | 437/208 |
| 5,126,286 | 6/1992 | Chance | 437/226 |
| 5,147,815 | 9/1992 | Casto | 437/51 |
| 5,185,295 | 2/1993 | Goto | 437/226 |
| 5,266,833 | 11/1993 | Capps | 257/690 |
| 5,292,686 | 3/1994 | Kiley | 437/227 |
| 5,376,235 | 12/1994 | Langly | 156/63.81 |
| 5,455,455 | 10/1995 | Badehi | 437/227 |

FOREIGN PATENT DOCUMENTS

| | | |
|---|---|---|
| 0211609 | 2/1987 | European Pat. Off. . |
| 0490739 | 6/1992 | European Pat. Off. . |
| 1591105 | 9/1970 | Germany . |
| 0017644 | 1/1990 | Japan . |
| 0191358 | 7/1990 | Japan . |
| 8502283 | 5/1985 | WIPO . |

OTHER PUBLICATIONS

D. Richmould, Micro SMT Integrated Circuit Technical White Paper, Micro SMT Inc. Jan. 25, 1993, pp. 1–15.
Tessera Compliant Chip, Technology Overview, Tessera System Building Blocks, San Jose, Ca. 1993.
Background Information—R&D 100 Technology's Brightest Stars, Tessera System Building Blocks, San Jose, CA. 1993.

*Primary Examiner*—John F. Niebling
*Assistant Examiner*—Ha Tran Nguyen
*Attorney, Agent, or Firm*—Ladas & Parry

[57] ABSTRACT

A method for producing integrated circuit devices including the steps of producing a plurality of integrated circuits on a wafer, each of the integrated circuits including a multiplicity of pads and thereafter slicing the wafer, thereby to define a plurality of integrated circuit elements, and wherein the step of slicing exposes sectional surfaces of the multiplicity of pads. Apparatus for carrying out the method and integrated circuit devices are also described and claimed.

17 Claims, 12 Drawing Sheets

6,117,707

METHODS OF PRODUCING INTEGRATED CIRCUIT DEVICES

This application is a continuation of application Ser. No. 08/274,251 filed on Jul. 13, 1994, now U.S. Pat. No. 5,547,906 which is a Divisional of application Ser. No. 07/962,222 filed Aug. 20, 1993 (now U.S. Pat. No. 5,455,455) which is of International Application PCT/EP92/02134 filed on Sep. 14, 1992 and which designated the U.S.

FIELD OF THE INVENTION

The present invention relates to methods and apparatus for producing integrated circuit devices and to integrated circuit devices produced thereby.

BACKGROUND OF THE INVENTION

An essential step in the manufacture of all integrated circuit devices is known as "packaging" and involves mechanical and environmental protection of a silicon chip which is at the heart of the integrated circuit as well as electrical interconnection between predetermined locations on the silicon chip and external electrical terminals.

At present three principal technologies are employed for packaging semiconductors: wire bonding, tape automatic bonding (TAB) and flip chip.

Wire bonding employs heat and ultrasonic energy to weld gold bonding wires between bond pads on the chip and contacts on the package.

Tape automatic bonding (TAB) employs a copper foil tape instead of bonding wire. The copper foil tape is configured for each specific die and package combination and includes a pattern of copper traces suited thereto. The individual leads may be connected individually or as a group to the various bond pads on the chip.

Flip chips are integrated circuit dies which have solder bumps formed on top of the bonding pads, thus allowing the die to be "flipped" circuit side down and directly soldered to a substrate. Wire bonds are not required and considerable savings in package spacing may be realized.

The above-described technologies each have certain limitations. Both wire bonding and TAB bonding are prone to bad bond formation and subject the die to relatively high temperatures and mechanical pressures. Both wire bond and TAB technologies are problematic from a package size viewpoint, producing integrated circuit devices having a die-to-package area ratio ranging from about 10% to 60%.

The flip-chip does not provide packaging but rather only interconnection. The interconnection encounters problems of uniformity in the solder bumps as well as in thermal expansion mismatching, which limits the use of available substrates to silicon or materials which have thermal expansion characteristics similar to those of silicon.

SUMMARY OF THE INVENTION

The present invention seeks to provide apparatus and techniques for production of integrated circuit devices which overcome many of the above limitations and provide integrated circuits of relatively smaller size and weight and enhanced electrical performance.

There is thus provided in accordance with a preferred embodiment of the present invention a method for producing integrated circuit devices including the steps of:

producing a plurality of integrated circuits on a wafer having first and second planar surfaces, each of the integrated circuits including a multiplicity of pads;

waferwise attaching to both said surfaces of the wafer a layer of protective material; and thereafter slicing the wafer and the protective material attached thereto, thereby to define a plurality of prepackaged integrated circuit devices.

It is noted that the term "waferwise" does not require that a whole wafer be so processed at a given time. "Waferwise" applies equally to steps applied to multiple dies prior to dicing thereof.

In accordance with a preferred embodiment of the present invention the step of slicing exposes sectional surfaces of the multiplicity of pads.

Preferably the step of slicing cuts pads so as to simultaneously define electrical contact regions for both of a pair of adjacent integrated circuits.

Additionally in accordance with a preferred embodiment of the present invention there is provided a method for producing integrated circuit devices including the steps of:

producing a plurality of integrated circuits on a wafer, each of the integrated circuits including a multiplicity of pads; and thereafter slicing the wafer, thereby to define a plurality of integrated circuit elements, and wherein the step of slicing exposes sectional surfaces of the multiplicity of pads.

Preferably the step of slicing cuts a plurality of pads including some which communicate with a one of a pair of adjacent integrated circuits and others with communication with another of the pair of adjacent integrated circuits, thereby to define electrical contact regions for both of said pair of adjacent integrated circuits.

In accordance with a preferred embodiment of the present invention there are also provided steps of providing a conductive layer over sliced edges of the integrated circuits in electrical communication with the exposed edges of the pads and wherein portions of the conductive layer communicating with separate ones of the multiplicity of pads are electrically separated from one another.

Preferably there is also provided a step of providing an electrical insulative layer along the sliced edges of the integrated circuit before the step of providing a conductive layer.

In accordance with a preferred embodiment of the present invention, the step of providing a conductive layer comprises forming a conductive coating also over non-edge portions of the integrated circuit.

Preferably the slicing step includes the steps of scribing and subsequent etching of the wafer.

Additionally in accordance with a preferred embodiment of the present invention there is provided a method for producing integrated circuit devices comprising the steps of:

producing a plurality of integrated circuits each having a multiplicity of exposed pad edges; and establishing electrical connections between the plurality of integrated circuits and a circuit board via said multiplicity of exposed pad edges.

Preferably the slicing step is carried out at locations whereby the silicon substrate is not exposed at the sliced edges of the resulting integrated circuits. It is appreciated that substrates of materials other than silicon, such as gallium arsenide and germanium may alternatively be used for certain applications. For the sake of conciseness, the term "silicon" is used throughout the specification and claims in an unusually broad sense to include also materials other than silicon which may be employed as integrated circuit substrates, notwithstanding that certain of the techniques and processes described herein in specific embodiments are suitable particularly for silicon.

In accordance with a preferred embodiment of the present invention, prior to the slicing step, the integrated circuits are surrounded on their planar surfaces by protective insulation layers and on their edges by epoxy.

Preferably a thermal bonding pad is formed on at least one outer planar surface of said integrated circuit devices.

Additionally in accordance with a preferred embodiment of the present invention there is also provided the step of providing an integrally formed ground plane in said integrated circuit devices.

Further in accordance with a preferred embodiment of the present invention, a plurality of wafers bearing integrated circuits are joined together in a stacked arrangement to provide multi-layer integrated circuit devices.

In accordance with a preferred embodiment of the present invention, the step of mounting the integrated circuit devices along their edges onto a mounting element.

Preferably, the protective layer is transparent to radiation which is used for erasing EPROM devices.

In accordance with a preferred embodiment of the present invention anti-corrosion treatment of electrical contacts of said integrated circuit devices is carried out. Specifically, the edges of exposed pads are preferably subject to anti-corrosion treatment.

Additionally in accordance with a preferred embodiment of the present invention there is provided a method for producing semiconductor devices comprising the steps of:

forming a semiconductor element inside a mechanically protective and electrically insulative package having a plurality of exposed cross-sections of electrical pads exposed at edges thereof; and providing electrical connections between the exposed cross-sections and external circuitry.

Preferably, the step of forming a semiconductor element comprises waferwise attachment of protective layers onto a wafer and subsequent dicing of the wafer into individual dies. It is noted that the term "waferwise" does not require that a whole wafer be so processed at a given time. "Waferwise" applies equally to steps applied to multiple dies prior to dicing thereof.

Additionally in accordance with a preferred embodiment of the present invention there is provided apparatus for producing integrated circuit devices including:

apparatus for producing a plurality of integrated circuits on a wafer having opposite planar surfaces, each of the integrated circuits including a multiplicity of pads;

apparatus for waferwise attaching to both said surfaces of the wafer a layer of protective packaging material; and slicing apparatus thereafter slicing the wafer and the protective material attached thereto, thereby to define a plurality of prepackaged integrated circuit devices.

Preferably the slicing apparatus exposes sectional surfaces of the multiplicity of pads and the apparatus for slicing cuts pads which communicate with adjacent integrated circuits, thereby to simultaneously define electrical contact regions for the adjacent integrated circuits.

Further in accordance with a preferred embodiment of the invention there is provided apparatus for producing integrated circuit devices including:

apparatus for producing a plurality of integrated circuits on a wafer, each of the integrated circuits including a multiplicity of pads; and slicing apparatus for thereafter slicing the wafer, thereby to define a plurality of integrated circuit elements, and wherein slicing apparatus is operative to expose sectional surfaces of the multiplicity of pads.

Preferably, the slicing apparatus cuts a plurality of pads including some which communicate with a one of a pair of adjacent integrated circuits and others with communication with another of the pair of adjacent integrated circuits, thereby to define electrical contact regions for both of said pair of adjacent integrated circuits.

In accordance with a preferred embodiment of the present invention there is also provided apparatus for providing a conductive layer over sliced edges of the integrated circuit in electrical communication with the edges of the pads and electrically separating portions of the conductive layer communicating with separate ones of the multiplicity of pads.

Preferably there is also provided apparatus for providing an electrical insulative layer along the sliced edges of the cut integrated circuit before provision of a conductive layer thereon.

Preferably, the conductive layer comprises a conductive coating over more than the edge of the integrated circuit.

In accordance with a preferred embodiment of the present invention, the slicing apparatus includes apparatus for scribing and subsequent etching of the wafer.

Further in accordance with a preferred embodiment of the present invention there is provided apparatus for producing integrated circuit devices comprising:

means for producing a plurality of integrated circuits each having a multiplicity of exposed pad edges; and means for establishing electrical connections between the plurality of integrated circuits and a circuit board via the multiplicity of exposed pad edges.

Preferably the slicing apparatus is operative at locations whereby the silicon substrate is not exposed at the sliced edges of the resulting integrated circuits.

Preferably the apparatus of the present invention is operative to carry out any and all of the above-mentioned method steps.

Additionally in accordance with a preferred embodiment of the invention there is provided apparatus for producing semiconductor devices comprising:

apparatus for forming a semiconductor element inside a mechanically protective and electrically insulative package having a plurality of exposed cross-sections of electrical pads exposed at edges thereof; and apparatus for providing electrical connections between the exposed cross-sections and external circuitry.

In accordance with a preferred embodiment of the invention there is provided an integrated circuit device constructed according to a method or using apparatus having any of the foregoing features.

Additionally in accordance with a preferred embodiment of the present invention there is provided an integrated circuit device comprising:

an integrated circuit die having top and bottom surfaces formed of electrically insulative and mechanically protective material and electrically insulative edge surfaces having exposed sections of conductive pads.

Preferably the integrated circuit die comprises a plurality of silicon chips bonded together in stacked arrangement.

In accordance with a preferred embodiment of the present invention, the plurality of silicon chips are mutually insulated from each other within the integrated circuit die.

Preferably, the integrated circuit device includes conductive strips formed on the outer surface of the integrated circuit device and in electrical communication with the exposed sections of conductive pads. In accordance with a preferred embodiment of the present invention, the conductive strips extend along the edges of the integrated circuit device and also to planar surfaces of the integrated circuit device.

Preferably the conductive strips are formed on the outside surface of the integrated circuit device for interconnecting the exposed sections of conductive pads of a plurality of dies, thereby providing electrical interconnection therebetween.

In accordance with a preferred embodiment of the present invention, the integrated circuit device includes a plurality of silicon portions which are mutually isolated from each other.

Further in accordance with a preferred embodiment of the present invention, the integrated circuit device includes at least one silicon element which is mechanically and electrically isolated from the exterior surface of the device.

Additionally in accordance with a preferred embodiment of the present invention, the integrated circuit device includes an integrally formed thermal contact to a heat sink on an outer planar surface of the device and an integrally formed ground plane.

Preferably conductive strips are formed on the outside surface of the integrated circuit device for interconnecting the exposed sections of conductive pads at a plurality of edges.

BRIEF DESCRIPTION OF THE DRAWINGS

The present invention will be understood and appreciated more fully from the following detailed description, taken in conjunction with the drawings in which.

DETAILED DESCRIPTION OF PREFERRED EMBODIMENTS

Reference is now made to FIGS. 1–12B, which illustrate the production of integrated circuit devices in accordance with a preferred embodiment of the present invention.

Figure 1:
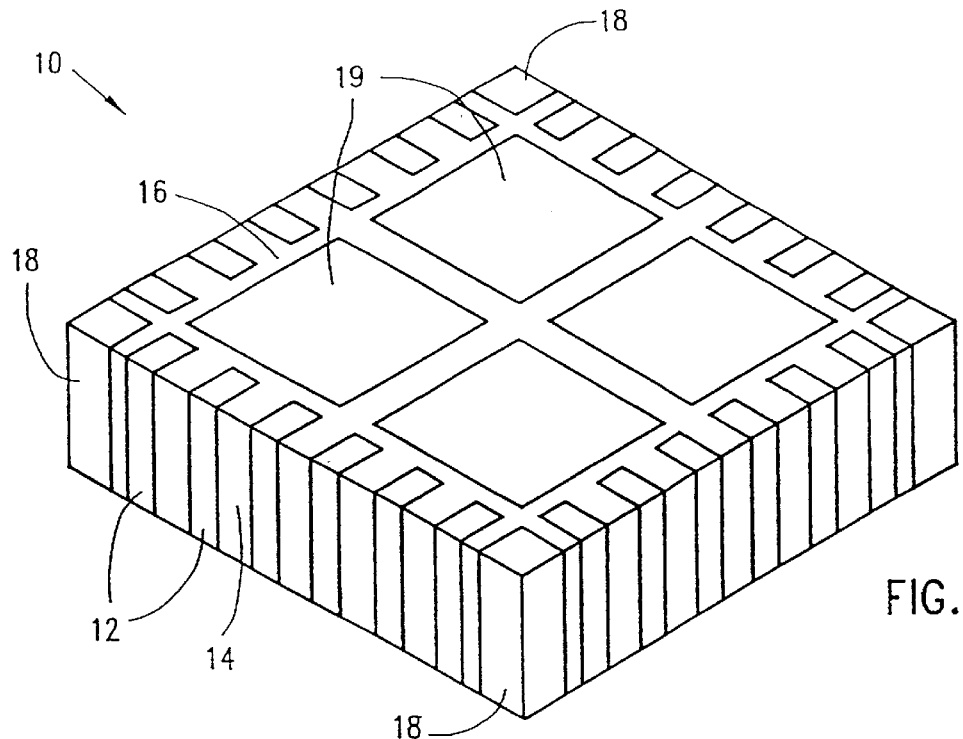
FIG. 1 is a simplified pictorial illustration of an integrated circuit device constructed and operative in accordance with a preferred embodiment of the present invention.

FIG. 1 illustrates a preferred embodiment of integrated circuit device constructed and operative in accordance with a preferred embodiment of the present invention and includes a relatively thin and compact, environmentally protected and mechanically strengthened integrated circuit package 10 having a multiplicity of electrical contacts 12 plated along the edge surfaces 14 thereof. In accordance with a preferred embodiment of the invention, contacts 12 extend over edge surfaces onto the planar surfaces 16 of the package. This contact arrangement permits both flat surface mounting and edge mounting of package 10 onto a circuit board. It is noted that the integrated circuit package 10 may include an integrally formed ground plane (not shown) as well as ground plane contacts 18.

In accordance with a preferred embodiment of the present invention, the integrated circuit package 10 may also include one or more thermal bonding pads 19 formed on one or both of the planar surfaces 16 thereof. The provision of such thermal bonding pads 19 is optional.

Figure 2:
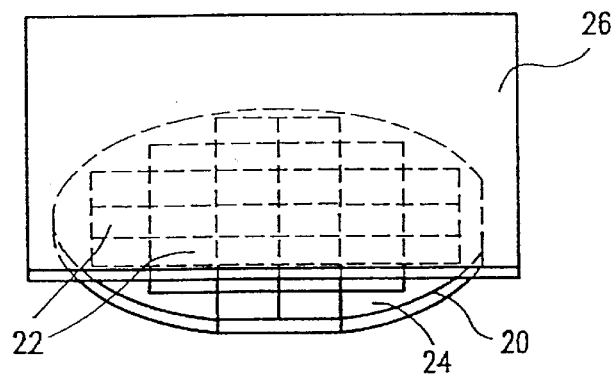
FIG. 2 is a simplified pictorial illustration of the attachment of a protective packaging layer to a wafer containing a plurality of integrated circuit dies.
Figure 4A:
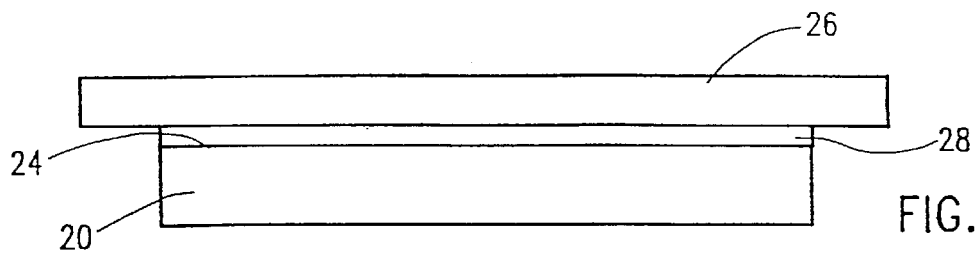
FIGS. 4A, 4B, 4C, 4D and 4E are sectional illustrations of various stages in the manufacture of integrated circuit devices in accordance with a preferred embodiment of the present invention.

In accordance with a preferred embodiment of the present invention, and as illustrated in FIG. 2 and FIG. 4A, a complete silicon wafer 20 having a plurality of finished dies 22 formed thereon by conventional techniques, is bonded at its active surface 24 to an insulating cover plate 26 via a layer 28 of epoxy. The insulating cover plate 26 typically comprises glass, alumina, beryllia, sapphire or any other suitable insulative substrate.

Cover plate 26 may be transparent to radiation in a spectral region useful for optical or infrared alignment.

It is appreciated that certain steps in the conventional fabrication of silicon wafer 20 may be eliminated when the wafer is used in accordance with the present invention. These steps include the provision of via openings in the passivation layers above pads, wafer back grinding and wafer back metal coating.

The complete silicon wafer 20 may be formed with an integral ground plane by conventional lithography techniques at any suitable location therein. Alternatively prior to the bonding step of FIG. 4A, a ground plane may be deposited and configured by conventional techniques over the active surface 24, such that the ground plane lies between active surface 24 and the epoxy layer 28.

Figure 4B:
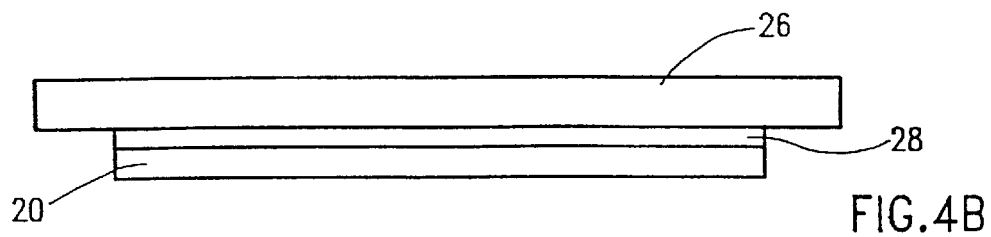

Following the bonding step described hereinabove, the silicon wafer is preferably ground down to a decreased thickness, typically 200 microns, as shown in FIG. 4B. This reduction in wafer thickness is enabled by the additional mechanical strength provided by the bonding thereof of the insulating cover plate 26.

Figure 3:
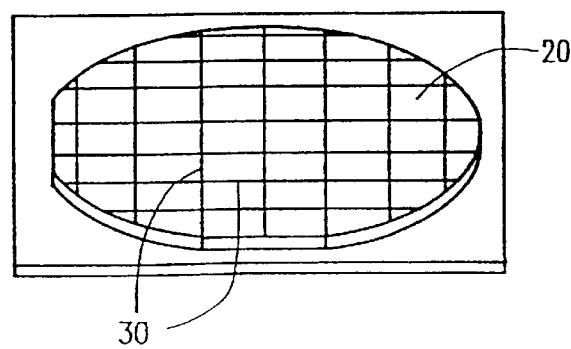
FIG. 3 is a simplified pictorial illustration of scribing of the wafer to define individual dies, following the attachment of a protective packaging layer to the wafer.

Following the reduction in thickness of the wafer, which is optional, the wafer is scribed along its back surface along predetermined dice lines which separate the individual dies. The scribed channels 30 are of sufficient depth to reduce the wafer thickness thereunder to typically 100 microns. The scribed wafer is shown in FIG. 3 and in FIG. 4C.

Figure 4C:
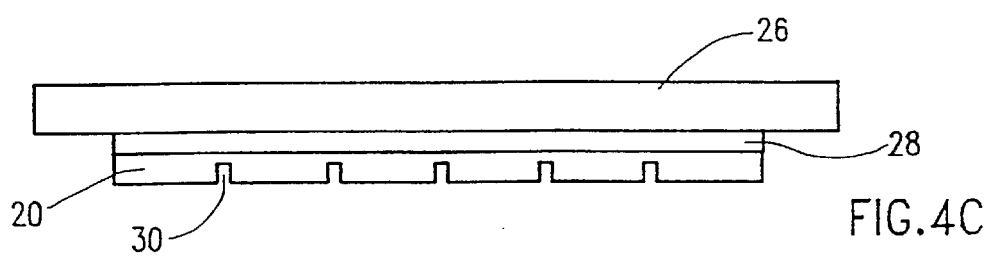
Figure 4D:
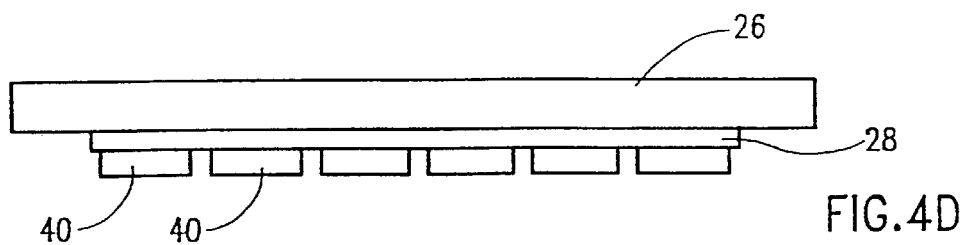
Figure 5:
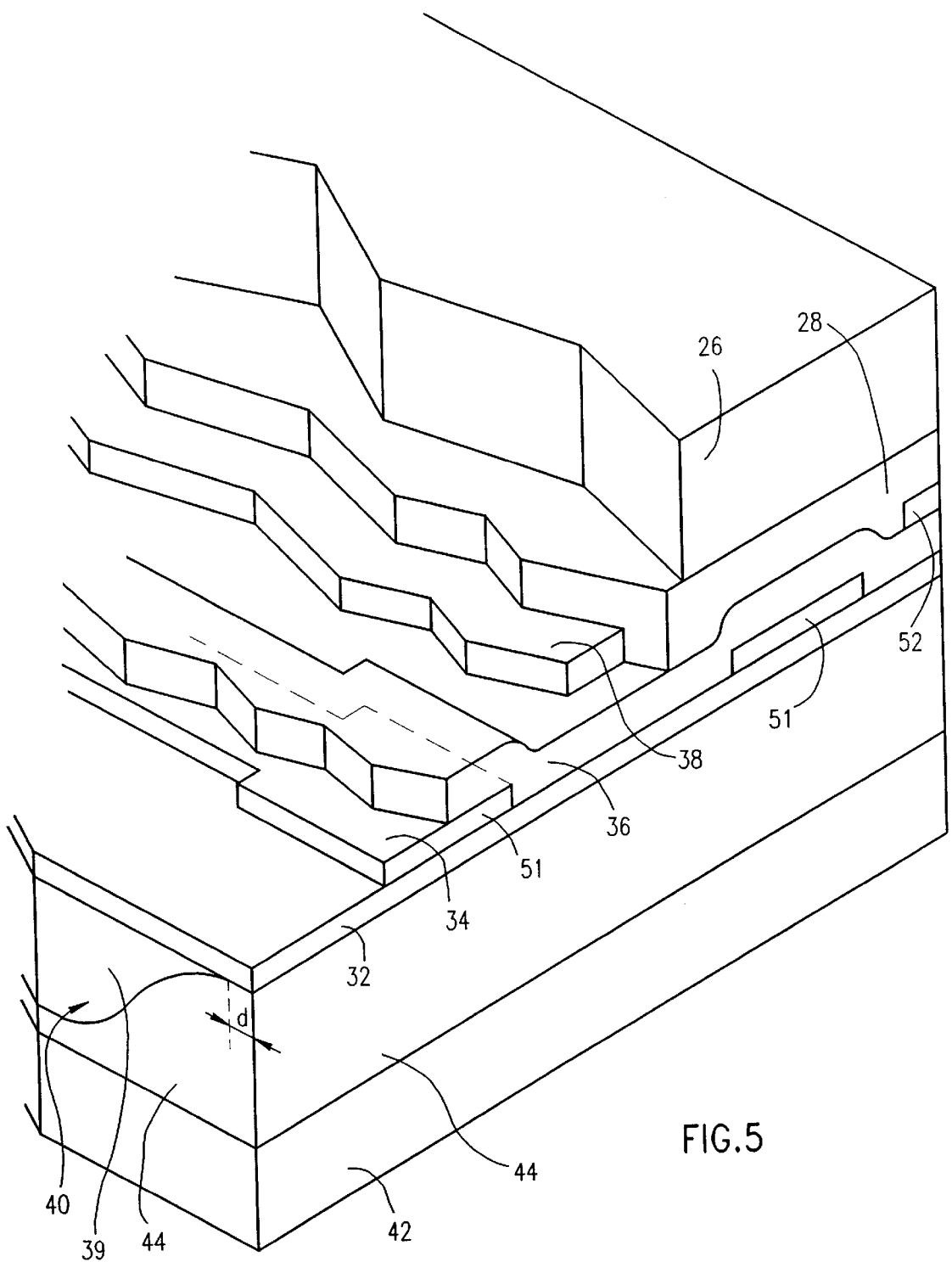
FIG. 5 is a partially cut away detailed pictorial illustration of an integrated circuit device produced by dicing the wafer of FIG. 4E.

The scribed wafer is then etched in a conventional silicon etching solution, such as a combination of 24% potassium hydroxide (KOH), 63% water and 13% Isopropanol, so as to etch the silicon down to the field oxide layer, as shown in FIG. 4D and more particularly in FIG. 5.

Referring now particularly to FIG. 5, at least one insulating layer, including the field oxide layer, is shown at reference numeral 32 and metal pads are shown at reference numeral 34. An over-metal insulating layer is shown at reference numeral 36. The ground plane is shown at reference numeral 38.

The result of the silicon etching is a plurality of separated dies 40, each of which includes silicon 39 of thickness about 100 microns.

Following the silicon etching, a second insulating packaging layer 42 is bonded over the dies 40 on the side thereof opposite to insulating packaging layer 26. A layer 44 of epoxy lies between the dies 40 and the layer 42 and epoxy also fills the interstices between dies 40.

Figure 4E:
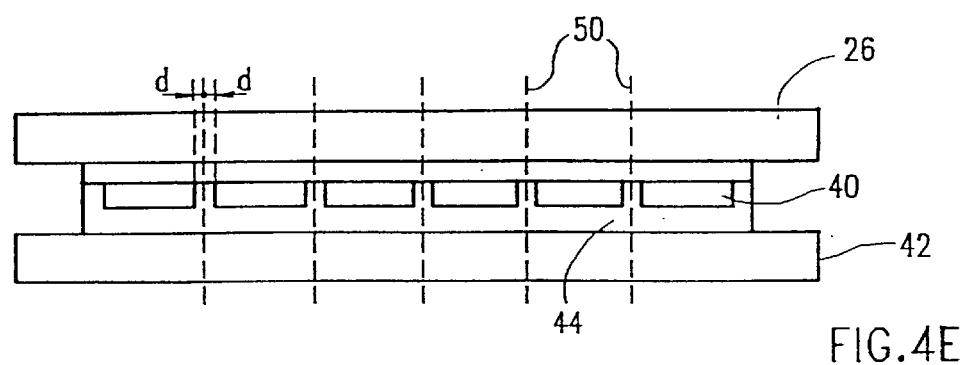

As seen in FIG. 4E, the sandwich of the dies 40, and the first and second insulating packaging layers 26 and 42 is then diced along lines 50, lying along the interstices between adjacent dies 40 to define a plurality of pre-packaged integrated circuits. It is a particular feature of the invention that lines 50 are selected such that the edges of the diced chips are distanced from the outer extent of the silicon 39 by at least a distance d, as shown in FIGS. 4E and 5.

It is a particular feature of the present invention that dicing of the sandwich of FIG. 4E along lines 50 exposes edges of a multiplicity of pads 34 on the wafer 20, which pad edges, when so exposed, define contact surfaces 51 of dies 40. Dicing of the sandwich of FIG. 4E also exposes edge portions of the ground plane 38 which define ground plane contact surfaces 52.

Figure 6:
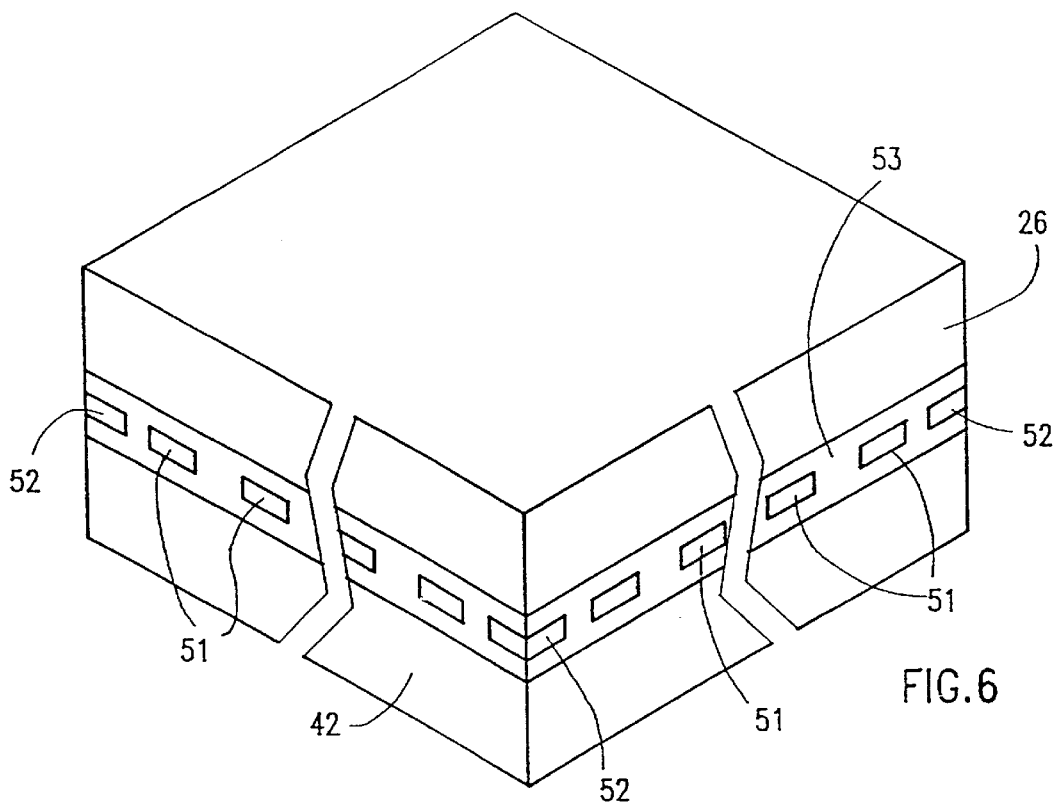
FIG. 6 is a pictorial illustration of an individual prepackaged die following dicing.

FIG. 6 illustrates an individual pre-packaged die following dicing. Other than the exposed contact surfaces 51 and 52, the entire integrated circuit device is peripherally sealed by epoxy 53 between insulating packaging layers 26 and 42 which define the integrated circuit package.

Figure 7:
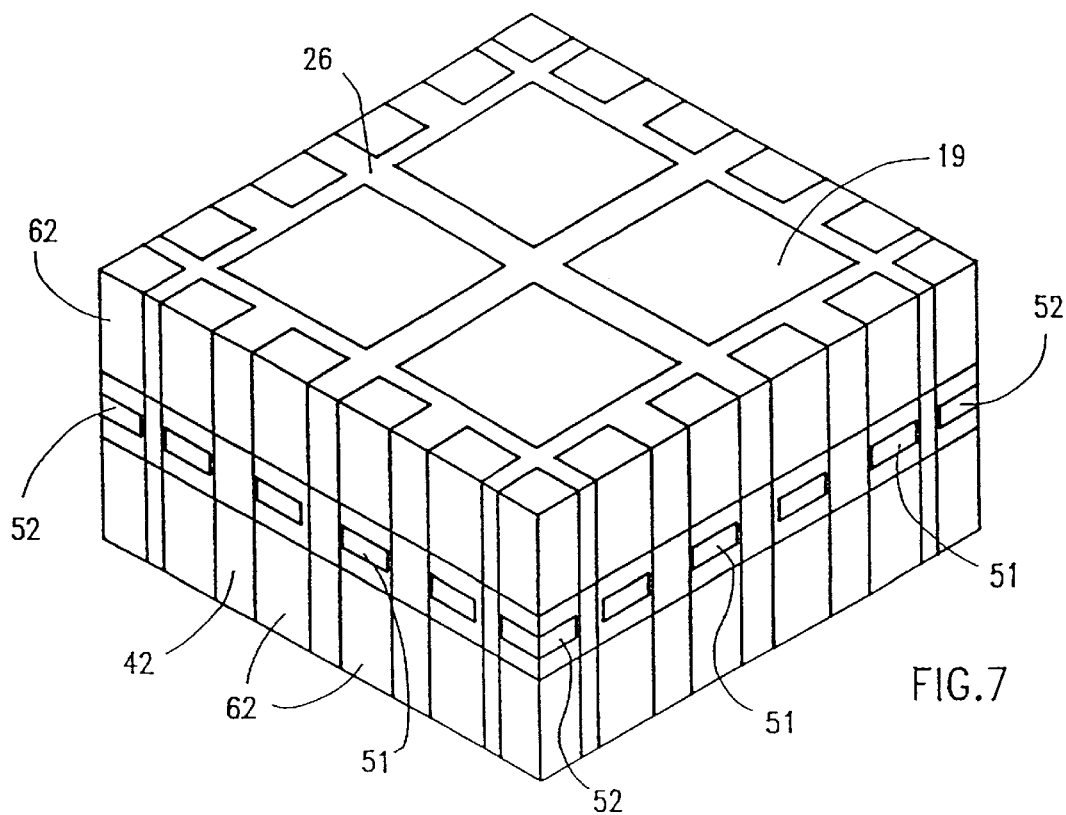
FIG. 7 is a pictorial illustration of the die of FIG. 6 following conductive coating deposition and during photoresist lithography.

In accordance with a preferred embodiment of the invention, all or part of the die or at least the edges thereof is coated with a conductive coating, such as aluminum, as by vacuum deposition. Using standard photoresist lithography techniques, this conductive coating is selectively etched, as indicated in FIG. 7 to define mutually electrically insulated conductive strips 62, each of which electrically communicates with a different contact surface 51 or 52. The thermal bonding pads 19 may also be defined at this stage.

Figure 8:
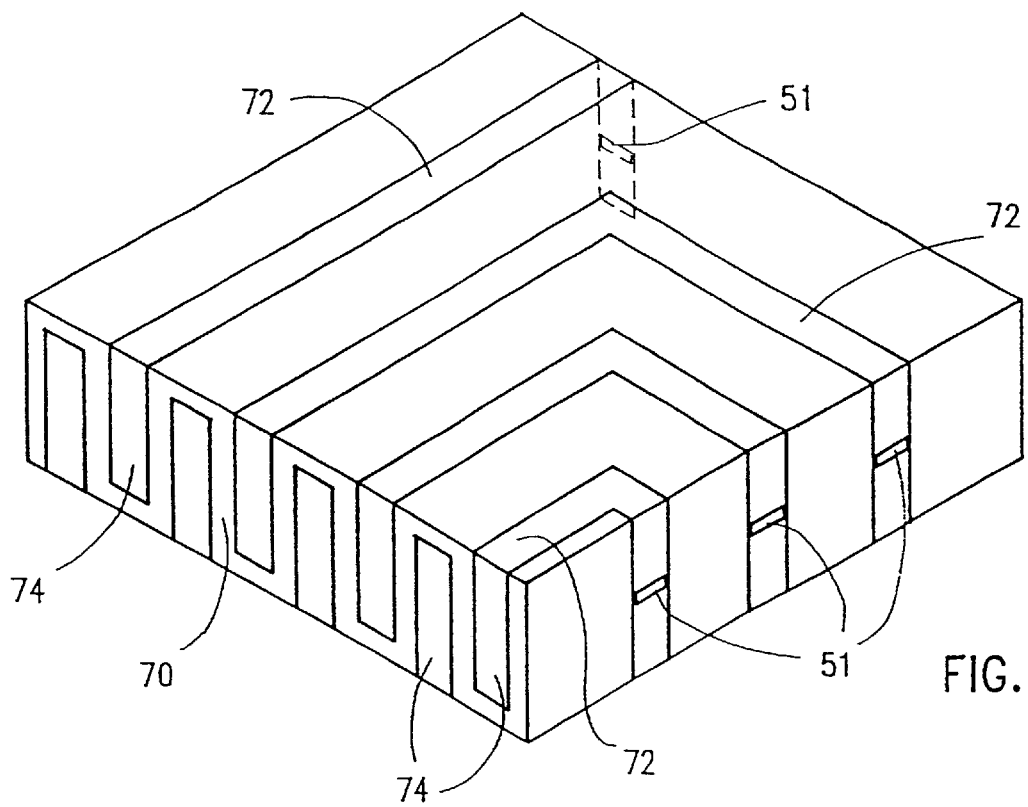
FIG. 8 is an illustration of an alternative configuration of integrated circuit package particularly suitable for vertical mounting.

The conductive layers are preferably nickel coated and may also be gold plated and/or solder coated by conventional techniques. FIG. 8 illustrates an alternative embodiment of the present invention wherein all of the contact strips appear on at least one edge 70 thereof, which edge may then be surface mounted onto a printed circuit board, for providing vertical mounting of the integrated circuit device. The illustrated embodiment provides conductive pathways 72 communicating between individual contact surfaces 51 on various edges of the device and contact strips 74 on edge 70. Such pathways may be formed on one or both of the planar surfaces of the integrated circuit package.

Figure 9:
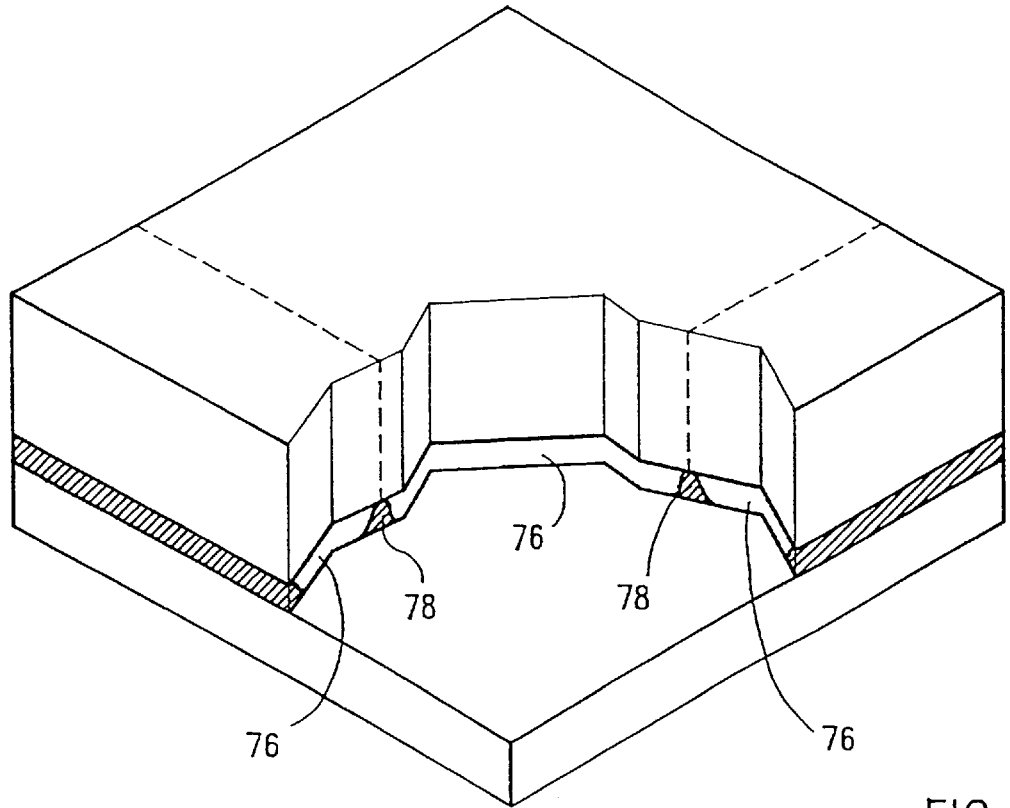
FIG. 9 is an illustration of a integrated circuit die having substrate isolation in accordance with a preferred embodiment of the present invention.

Reference is now made to FIG. 9, which illustrates another optional feature of the present invention. As seen in FIG. 9, substrate isolation of part of an integrated circuit die may be readily provided by adding extra scribe lines and etching therealong as illustrated in FIGS. 4C and 4D, but within a given die boundary, rather than along die boundaries. Following such scribing and etching the separation between adjacent portions 76 of the silicon substrate is filled with epoxy 78.

Figure 10:
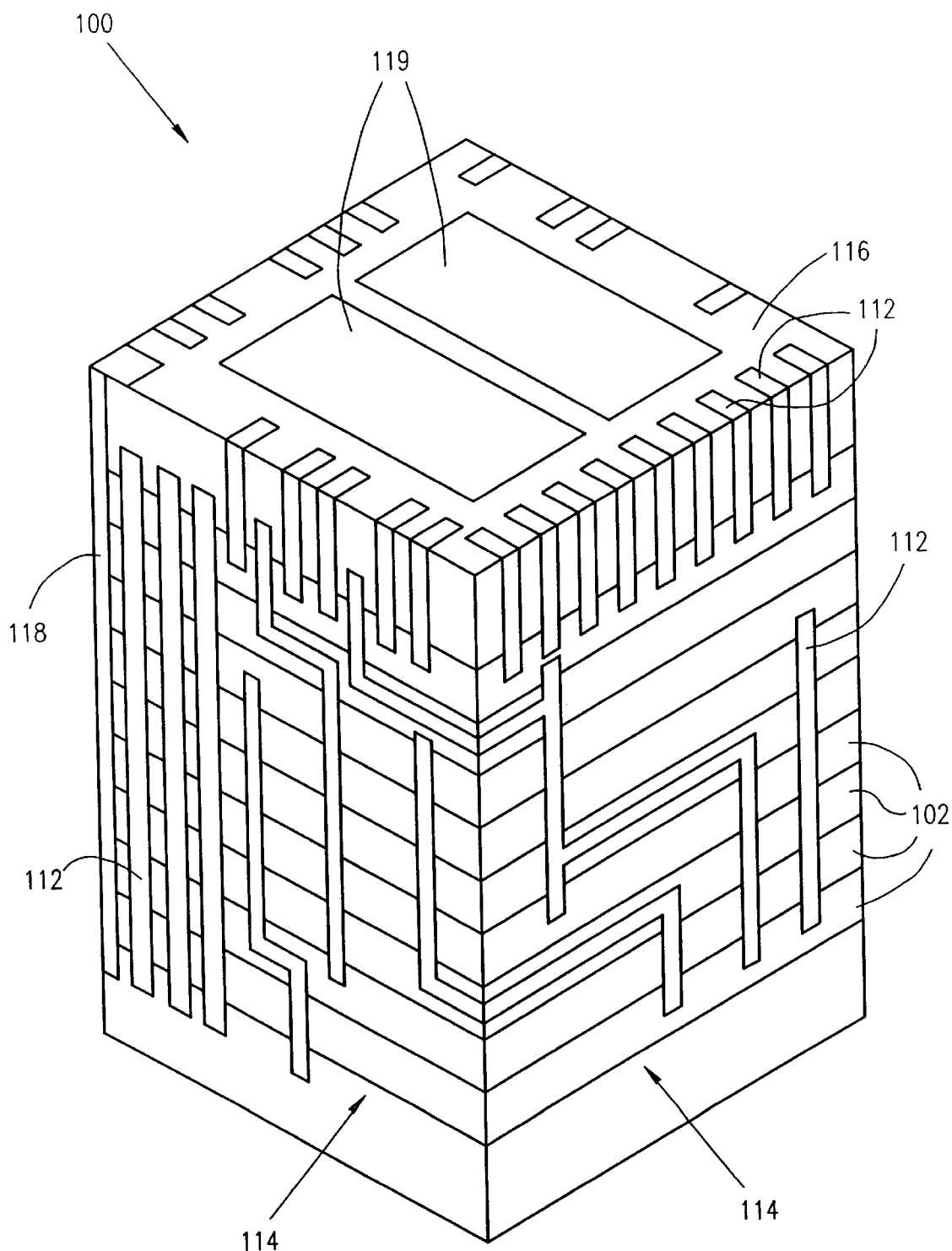
FIG. 10 is an illustration of a multi-die integrated circuit package constructed and operative in accordance with a preferred embodiment of the invention.

Reference is now made to FIG. 10 which is an illustration of a multi-die integrated circuit package 100 constructed and operative in accordance with a preferred embodiment of the invention.

As distinct from the embodiment of FIGS. 1–9, wherein the package includes only a single die, the embodiment of FIG. 10 includes a plurality of dies 102, preferably arranged in a stacked arrangement. Each die 102 may have an identical or different circuit thereon. The dies may be stacked one upon an other in electrically insulative relationship, with or without the interposition of additional insulative layers therebetween.

The multi-die integrated circuit package 100 is relatively thin and compact, environmentally protected and mechanically strengthened and has a multiplicity of electrical contacts 112 plated along the edge surfaces 114 thereof. In accordance with a preferred embodiment of the invention, contacts 112 extend over edge surfaces onto the planar surfaces 116 of the package. This contact arrangement permits both flat surface mounting and edge mounting of package 100 onto a circuit board. It is noted that the integrated circuit package 100 may include one or more integrally formed ground planes (not shown) as well as ground plane contacts 118. Additionally, one or more specific dies, such as an ASIC, for providing complex interconnect functions may be interposed among the stacked integrated circuits.

In accordance with a preferred embodiment of the present invention, the integrated circuit package 100 may also include one or more thermal bonding pads 119 formed on one or both of the planar surfaces 116 thereof. The provision of such thermal bonding pads 119 is optional.

FIGS. 11A, 11B, 11C, 11D, 11E, 11F, 11G, 11H, 11I, 11J, 11K, 11L and 11M are sectional illustrations of various stages in the manufacture of multi-die integrated circuit devices in accordance with a preferred embodiment of the present invention.

Figure 11A:
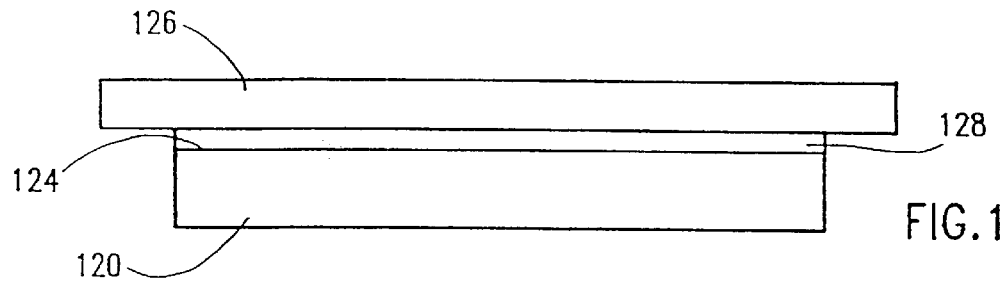
FIGS. 11A, 11B, 11C, 11D, 11E, 11F, 11G, 11H, 11I, 11J, 11K, 11L and 11M are sectional illustrations of various stages in the manufacture of integrated circuit devices in accordance with a preferred embodiment of the present invention.

Similarly or identically to the steps of FIGS. 4A–4D in the embodiment of FIGS. 1–9 and in accordance with a preferred embodiment of the present invention, and as illustrated in FIG. 11A, a complete silicon wafer 120 having a plurality of dies 122 formed thereon by conventional techniques, is bonded at its active surface 124 to an insulating cover plate 126 via a layer 128 of epoxy. The insulating cover plate 126 typically comprises glass, alumina, beryllia, sapphire or any other suitable insulative substrate.

The complete silicon wafer 120 may be formed with an integral ground plane by conventional techniques at any suitable location therein. Alternatively prior to the bonding step of FIG. 11A, a ground plane may be deposited and configured by conventional techniques over the active surface 124, such that the ground plane lies between active surface 124 and the epoxy layer 128.

Figure 11B:
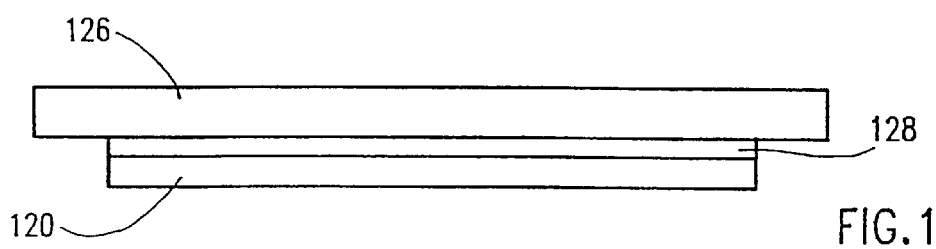

Following the bonding step described hereinabove, the silicon wafer is preferably ground down to a decreased thickness, typically 200 microns, as shown in FIG. 11B.

Figure 11C:
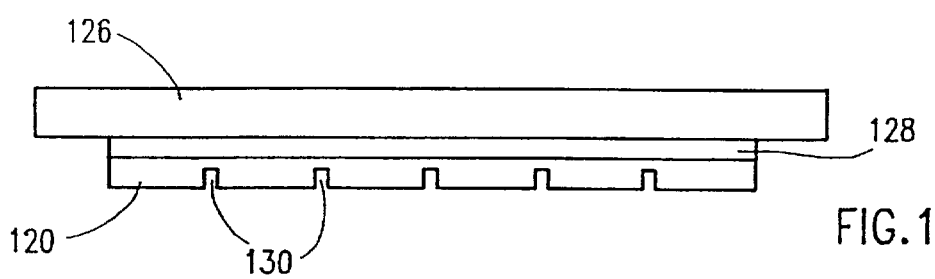

Following the reduction in thickness of the wafer, which is optional, the wafer is scribed along its back surface along predetermined dice lines which separate the individual dies. The scribed channels 130 are of sufficient depth to reduce the wafer thickness thereunder to typically 100 microns. The scribed wafer is shown in FIG. 11C.

Figure 11D:
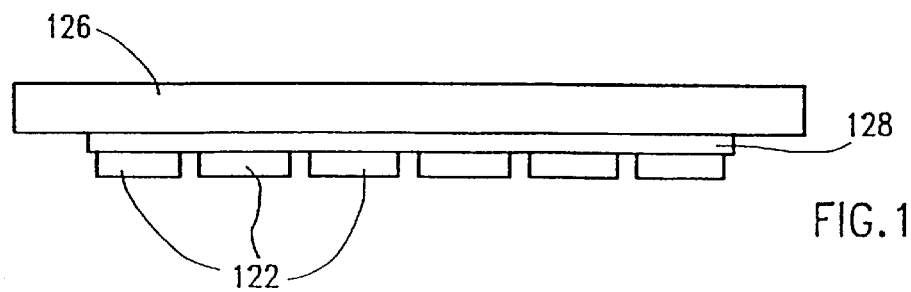

The scribed wafer is then etched in a conventional silicon etching solution, such as that described hereinabove, so as to etch the silicon down to the field oxide layer, as shown in FIG. 11D.

At this stage each die is configured generally as shown in FIG. 5, described above.

Figure 11E:
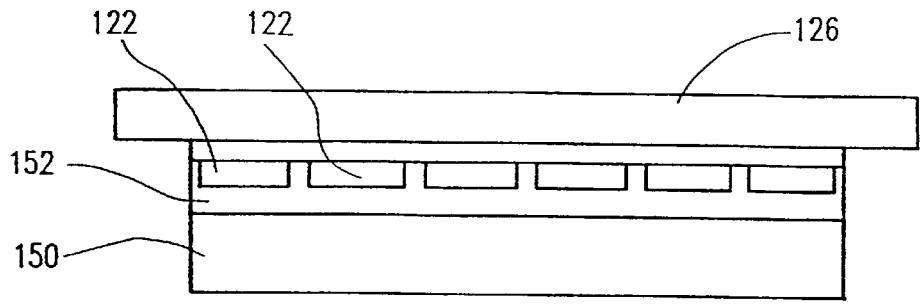

In the construction of the multi-die integrated circuit device, instead of bonding and dicing the wafer following the step of FIG. 4D, as in the embodiment of FIGS. 1–9, an additional wafer 150 is bonded over scribed and etched dies 122, as illustrated in FIG. 11E, the epoxy 152 which is used for the bonding, filling in the interstices between silicon substrates of adjacent dies 122 and thus providing isolation thereof in addition to that provided by the oxide passivation layer on each die.

Figure 11F:
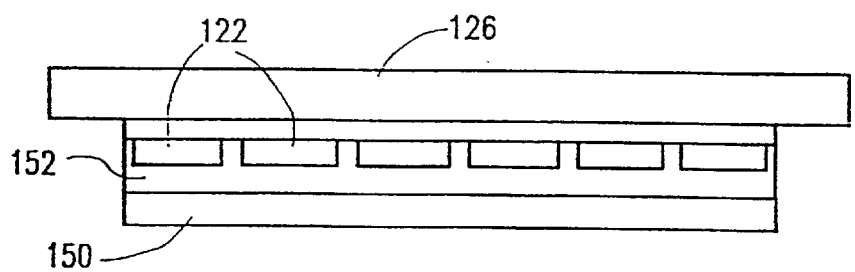
Figure 11G:
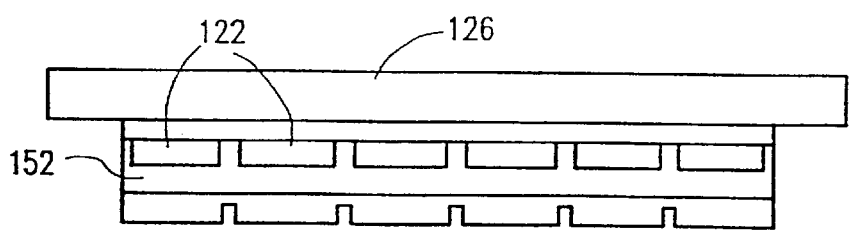
Figure 11H:
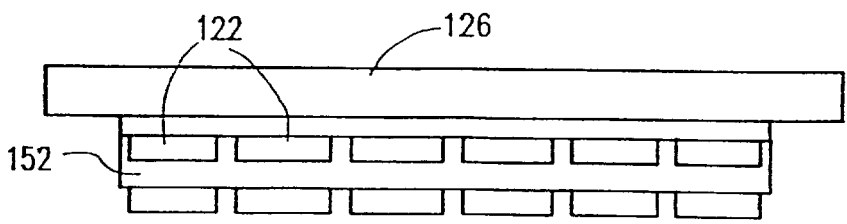

Following the bonding step of FIG. 11E, the thickness of wafer 150 is reduced, as shown in FIG. 11F and wafer 150 is scribed and then etched, as shown in FIGS. 11G and 11H respectively and as described hereinabove in connection with FIGS. 4B–4D.

Figure 11I:
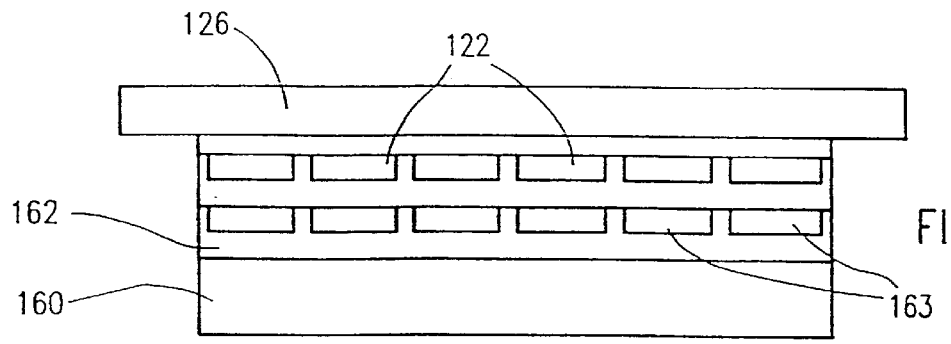

Following the etching step of FIG. 11H, an additional wafer 160 is bonded over scribed and etched wafer 150, as illustrated in FIG. 11I, the epoxy 162 which is used for the bonding, filling in the interstices between silicon substrates of adjacent dies 163 on wafer 150 and thus providing isolation thereof.

Figure 11J:
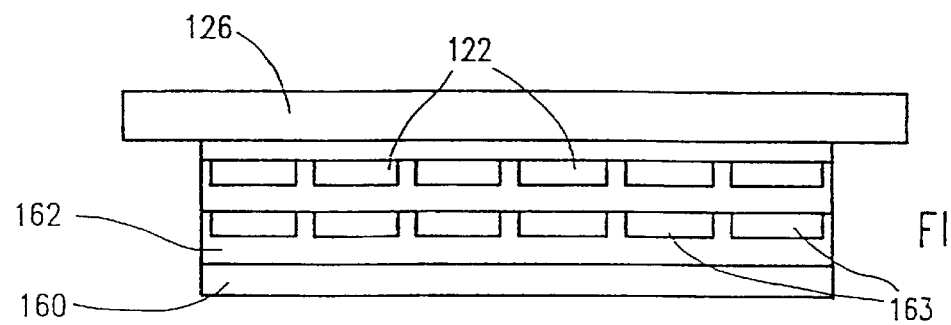
Figure 11K:
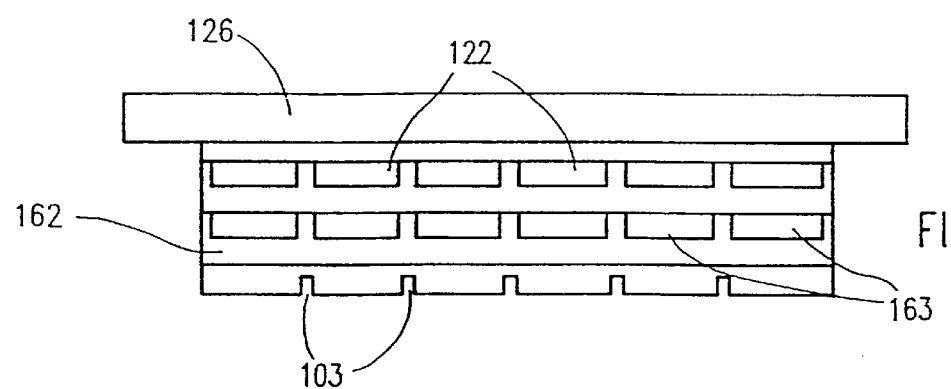
Figure 11L:
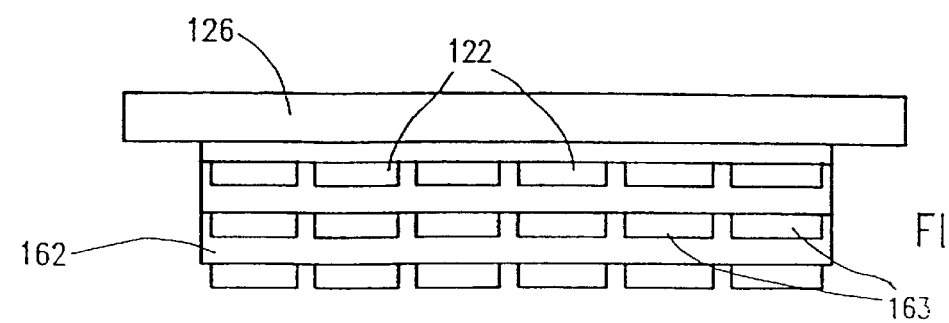

Following the bonding step of FIG. 11I, the thickness of wafer 160 is reduced, as shown in FIG. 11J and wafer 160 is scribed and then etched, as shown in FIGS. 11K and 11L respectively and as described hereinabove in connection with FIGS. 4B–4D.

The above described process is repeated, wafer by wafer until a desired number of wafers is bonded together.

Figure 11M:
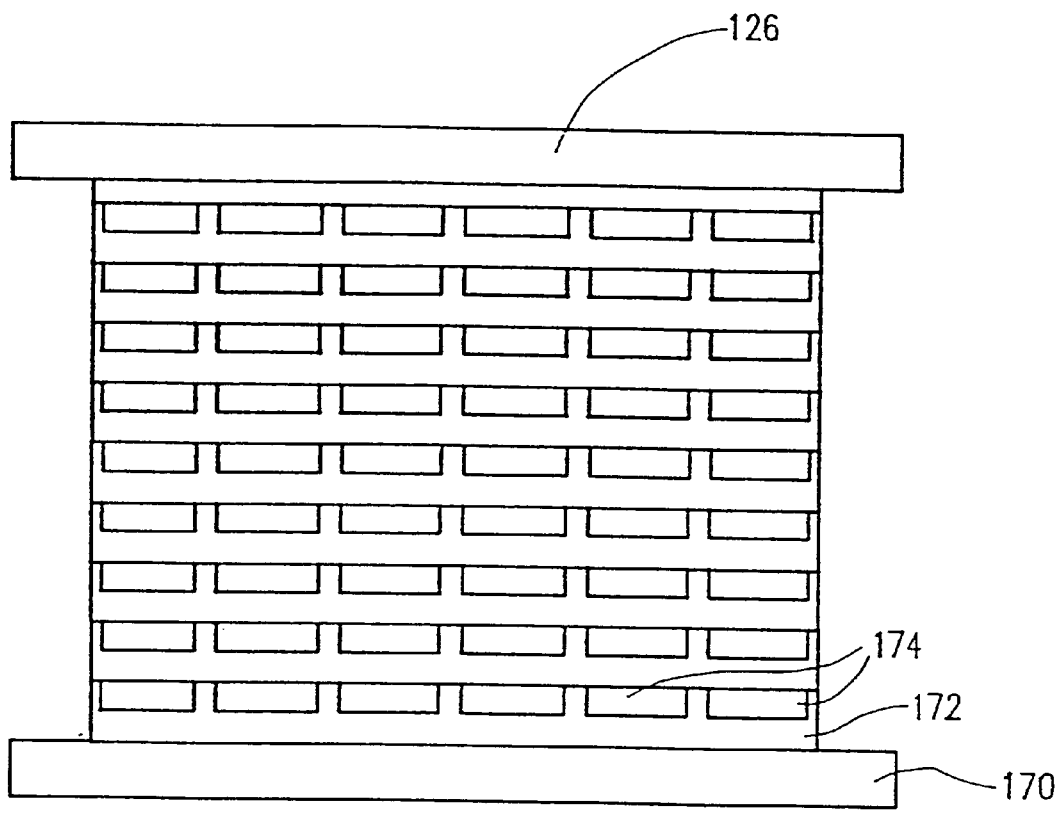

Following the silicon etching of the last of such wafers, a second insulating packaging layer 170 is bonded thereto, as shown in FIG. 11M. A layer 172 of epoxy lies between the dies 174 on the last wafer and the layer 170 and the epoxy also fills the interstices between dies 174.

As described above in connection with FIG. 4E, the sandwich of the plurality of wafers and the first and second insulating packaging layers 126 and 170 is then diced along lines lying along the interstices between the adjacent dies on each wafer to define a plurality of pre-packaged integrated circuits.

It is a particular feature of the present invention that dicing of the sandwich of FIGS. 4E and 11M exposes edges of a multiplicity of pads on the wafers, which pad edges, when so exposed, define contact surfaces. These contact surfaces are preferably subjected to an anti-corrosion treatment. Dicing of the sandwich of FIG. 11M also exposes edge portions of the ground plane which define ground plane contact surfaces, which are also preferably subject to anti-corrosion treatment. Other than the exposed contact surfaces, the entire integrated circuit device is peripherally sealed by epoxy between insulating packaging layers 126 and 170 which define the integrated circuit package.

As in the embodiment of FIGS. 1–9, and in accordance with a preferred embodiment of the invention, all or part of the die or at least the edges thereof is coated with a conductive coating, such as aluminum, as by vacuum deposition. Using standard photoresist lithography techniques, this conductive coating is selectively etched, as indicated in FIG. 10 to define mutually electrically insulated conductive strips 112, each of which electrically communicates with a different contact surface. Conductive strips 112 may provide interconnection between the various dies as well as interconnection with external circuits. Ground plane contacts 118 and thermal bonding pads 119 may also be defined at this stage.

The conductive layers are preferably nickel coated and may also be gold plated and/or solder coated by conventional techniques. Suitable anti-corrosion treatments may also be provided. It is noted that the stacked integrated circuit package described hereinabove need not necessarily be formed of integrated circuit dies from a single whole wafer or even from the same wafer. The integrated circuit dies which are combined in the stack may be formed individually or in groups by any suitable technique. The integrated circuit dies preferably pass a sorting stage prior to being incorporated in a stack, in order to increase stack yield.

Improved heat dissipation in the stack may be achieved by incorporating insulative high thermal conductivity substrates in the die stack.

Figure 12A:
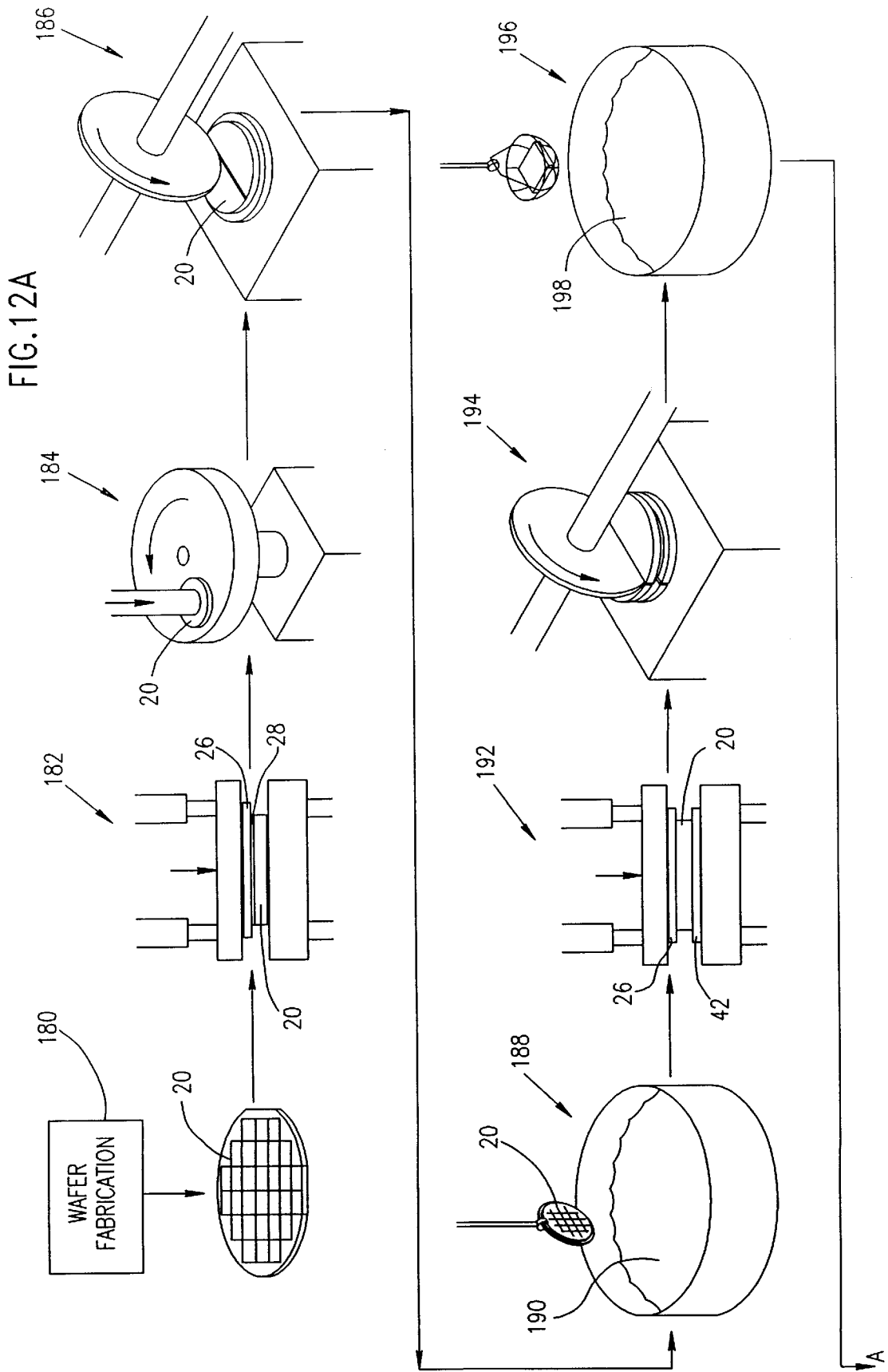
FIGS. 12A and 12B together provide a simplified block diagram illustration of apparatus for carrying out the method of the present invention.
Figure 12B:
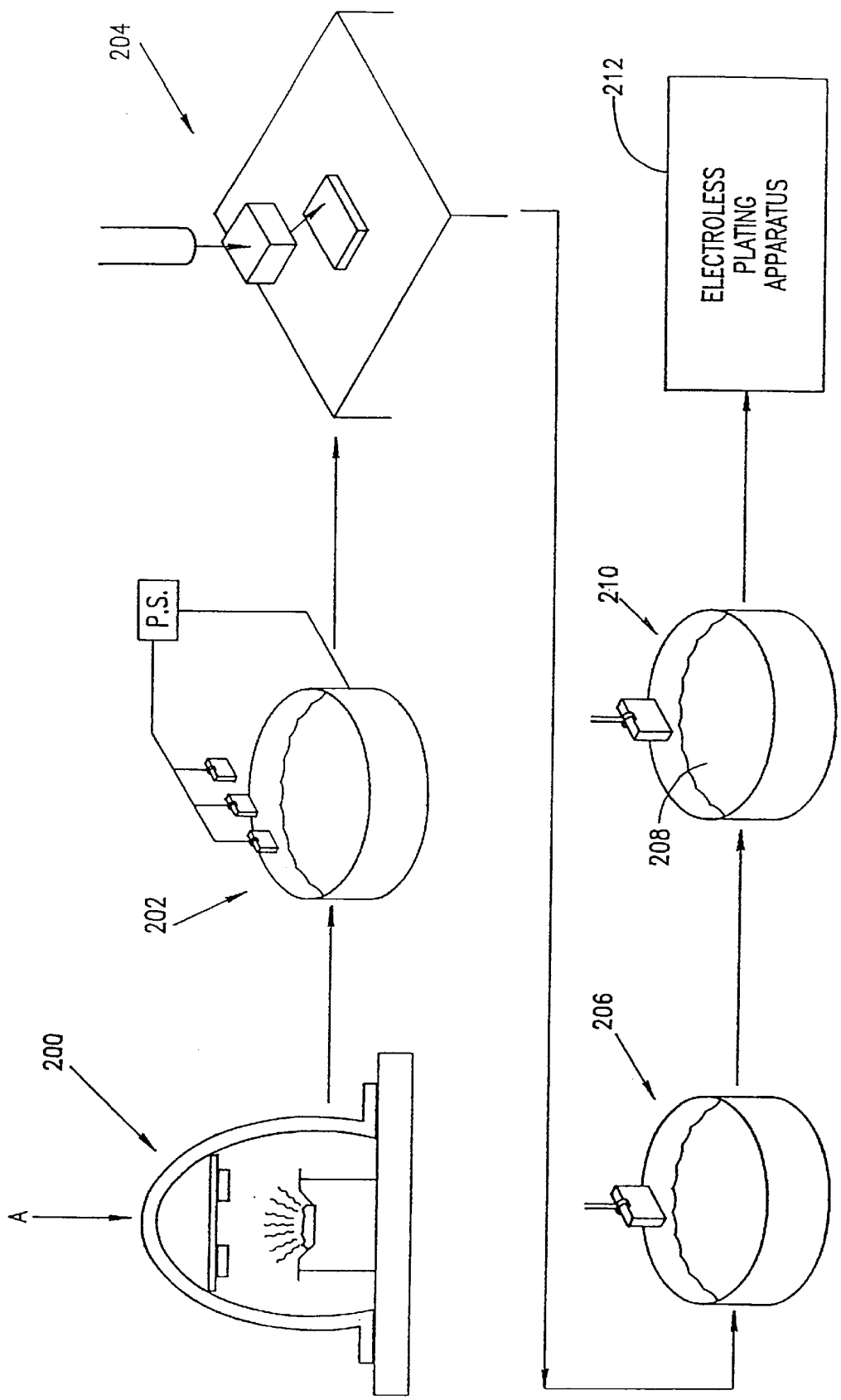

Reference is now made to FIGS. 12A and 12B, which together illustrate apparatus for producing integrated circuit devices in accordance with a preferred embodiment of the present invention. A conventional wafer fabrication facility 180 provides complete wafers 20. Individual wafers 20 are bonded on their active surfaces by bonding apparatus 182, preferably having facilities for rotation of the wafer 20, the layer 26 and the epoxy 28 so as to obtain even distribution of the epoxy.

The bonded wafer (FIG. 3) is thinned at its non-active surface as by grinding apparatus 184, such as Model 32BTGW using 12.5A abrasive, which is commercially available from Speedfam Machines Co. Ltd. of England.

The wafer is then scribed at its non-active surface by scribing apparatus 186 such as a Kulicke & Soffa 775 dicing saw employing an Ni plated diamond loaded blade, producing a result which is shown in FIG. 4C.

The scribed wafer of FIG. 4C is then etched in a temperature controlled bath 188 containing a silicon etch solution 190. Commercially available equipment for this purpose include a Chemkleen bath and an WHRV circulator both of which are manufactured by Wafab Inc. of the U.S.A. A suitable conventional silicon etching solution is Isoform Silicon etch, which is commercially available from Micro-Image Technology Ltd. of England. The wafer is conventionally rinsed after etching. The resulting etched wafer is shown in FIG. 4D.

The etched wafer is bonded on the non-active side to another protective layer 42 by bonding apparatus 192, which may be essentially the same as apparatus 182, to produce a doubly bonded wafer sandwich as shown in FIG. 4E.

Dicing apparatus 194, which may be identical to apparatus 186, dices the bonded wafer sandwich of FIG. 4E into individual dies. Preferably the dicing blade should be a diamond resinoid blade of thickness 4–12 mils. The resulting dies appear as illustrated generally in FIG. 6.

The diced dies are then subjected to anti-corrosion treatment in a bath 196, containing a chromating solution 198, such as described in any of the following U.S. Pat. Nos. 2,507,956; 2,851,385 and 2,796,370, the disclosure of which is hereby incorporated by reference.

Conductive layer deposition apparatus 200, which operates by vacuum deposition techniques, such as a Model 903M sputtering machine manufactured by Material Research Corporation of the U.S.A., is employed to produce a conductive layer on one or more surfaces of the die of FIG. 6.

Configuration of contact strips, as shown in FIG. 7, is carried out preferably by using conventional electro-deposited photoresist, which is commercially available from DuPont under the brand name Primecoat or from Shipley, under the brand name Eagle. The photoresist is applied to the dies in a photoresist bath assembly 202 which is commercially available from DuPont or Shipley.

The photoresist is preferably laser configured by a suitable laser scanner 204 to define suitable etching patterns. The photoresist is then developed in a development bath 206, and then etched in a metal etch solution 208 located in an etching bath 210, thus providing a conductor configuration such as that shown in FIG. 7.

The exposed conductive strips shown in FIG. 7 are then plated, preferably by electroless plating apparatus 212, which is commercially available from Okuno of Japan.

It will be appreciated that the provision of conductive strips may be achieved by techniques other than photolithography. Any suitable technique, such as direct writing, may alternatively be employed.

It will be apparent to persons skilled in the art that the present invention is not limited to what has been particularly shown and described hereinabove. Rather the scope of the present invention is defined only by the claims which follow:

What is claimed is:

1. A method of producing prepackaged integrated circuit devices comprising the steps of:

providing a wafer having a first surface and a second surface generally parallel to and oppositely directed with respect to said first surface;

producing a plurality of integrated circuit dies on said first surface of said wafer, each of the integrated circuit dies comprising a multiplicity of pads;

attaching a first electrically insulative plate to said plurality of integrated circuit dies on the first surface of said wafer;

attaching a second insulative plate to said second surface of said wafer, at least one of said insulative plates being transparent to radiation in an optical or infra-red spectral range;

separating the integrated circuit dies from each other so as to define edges thereof while the dies remain attached to the insulative plates;

generally surrounding said integrated circuits on said edges and said second surface with a protective sealant; and thereafter slicing the wafer and protective sealant and the insulative plates attached thereto, thereby to define a plurality of prepackaged integrated circuit devices.

2. A method according to claim 1, and wherein the step of slicing exposes cross sectional surfaces of said multiplicity of pads.

3. A method according to claim 1, and also comprising the steps of providing a conductive layer over edges of the integrated circuits formed by the slicing step and electrically separating portions of the conductive layer electrically connected with separate ones of said multiplicity of pads.

4. A method according to claim 3, and wherein an electrical insulative layer is present along the sliced edges of said integrated circuits before the step of providing a conductive layer.

5. A method according to claim 3, and wherein said step of providing a conductive layer comprises forming a conductive coating also over non-edge portions of the integrated circuit.

6. A method according to claim 1, and wherein a plurality of wafers bearing integrated circuits are joined together in a stacked arrangement to provide multi-layer integrated circuit devices.

7. A method according to claim 1, and also comprising anti-corrosion treatment of electrical contacts of said integrated circuit devices including exposed pad edges.

8. A method of producing prepackaged integrated circuit devices comprising the steps of:

providing a wafer having a first surface and a second surface generally parallel to and oppositely directed with respect to said first surface;

producing a plurality of integrated circuit dies on said first surface of said wafer, each of the integrated circuit dies comprising a multiplicity of pads;

attaching a first electrically insulative plate to said plurality of integrated circuit dies on the first surface of said wafer;

separating the integrated circuit dies from each other so as to define edges thereof while the dies remain attached to the insulative plate;

generally surrounding said integrated circuit dies on said edges with a protective sealant;

attaching a second insulative plate to said plurality of integrated circuit dies on said second surface of said wafer, at least one of said insulative plates being transparent to radiation in an optical or infra-red spectral range; and thereafter slicing the wafer and protective sealant and the insulative plates attached thereto, thereby to define a plurality of prepackaged integrated circuit devices.

9. A method according to claim 8, and wherein the step of slicing exposes sectional surfaces of said multiplicity of pads.

10. A method according to claim 8, and also comprising the steps of providing a conductive layer over sliced edges of the integrated circuits and electrically separating portions of the conductive layer communicating with separate ones of said multiplicity of pads.

11. A method according to claim 10, and wherein an electrical insulative layer is present along the sliced edges of said integrated circuits before the step of providing a conductive layer.

12. A method according to claim 10, and wherein said step of providing a conductive layer comprises forming a conductive coating also over non-edge portions of the integrated circuit.

13. A method according to claim 8, and wherein said slicing step is carried out at locations whereby the silicon substrate is not exposed at the sliced edges of the resulting integrated circuits.

14. A method according to claim 8, and wherein a plurality of wafers bearing integrated circuits are joined together in a stacked arrangement to provide multi-layer integrated circuit devices.

15. A method according to claim 8, and also comprising anti-corrosion treatment of electrical contacts of said integrated circuit devices including exposed pad edges.

16. A method of producing prepackaged integrated circuit devices comprising the steps of:

providing a wafer having a first surface and a second surface generally parallel to and oppositely directed with respect to said first surface;

attaching an insulative plate to said second surface of said wafer, said insulative plate being transparent to radiation in an optical or infra-red spectral range;

producing a plurality of integrated circuit dies on said first surface of said wafer, each of the integrated circuit dies comprising a multiplicity of aluminum pads;

exposing the multiplicity of pads; and applying anti-corrosion treatment to the multiplicity of pads, by employing a chromating solution.

17. A method according to claim 16, and also comprising the step of separating the integrated circuit dies from each other, thereby to define a plurality of integrated circuit devices.

\* \* \* \* \*